United States Patent
Iguchi et al.

[11] Patent Number: 5,948,847
[45] Date of Patent: Sep. 7, 1999

[54] UNDERCOATING COMPOSITION FOR PHOTOLITHOGRAPHIC PATTERNING

[75] Inventors: Etsuko Iguchi, Machida, Japan; Mitsuru Sato, Hillsboro, Oreg.

[73] Assignee: Tokyo Ohka Kogyo Co., Ltd., Japan

[21] Appl. No.: 08/985,359

[22] Filed: Dec. 4, 1997

[30] Foreign Application Priority Data

Dec. 13, 1996 [JP] Japan ................................ 8-334193

[51] Int. Cl.$^6$ ................................ C08K 5/13; F21V 7/22
[52] U.S. Cl. ................ 524/502; 430/302; 525/330.5; 524/333; 524/337
[58] Field of Search ................ 526/286, 326, 526/320, 323.1, 321; 525/330.5, 330.4, 328.5, 328.6, 328.8; 524/502, 337, 333; 430/286.1, 304, 302, 536, 537, 636, 629, 609; 523/172

[56] References Cited

U.S. PATENT DOCUMENTS

| | | | |
|---|---|---|---|
| 2,938,883 | 5/1960 | Raich | 524/291 |
| 3,810,938 | 5/1974 | Schmitt | 526/286 |
| 3,923,740 | 12/1975 | Schmitt et al. | 526/72 |
| 4,067,853 | 1/1978 | Schmitt et al. | 526/72 |
| 4,306,780 | 12/1981 | Tarumi et al. | 526/326 |
| 4,910,122 | 3/1990 | Arnold et al. | |
| 5,234,990 | 8/1993 | Flaim et al. | |
| 5,294,671 | 3/1994 | Szita et al. | 525/330.5 |
| 5,294,680 | 3/1994 | Knors et al. | |
| 5,545,828 | 8/1996 | Keita et al. | 526/286 |

FOREIGN PATENT DOCUMENTS

| | | |
|---|---|---|
| 0 542008 | 5/1993 | European Pat. Off. . |
| 0 803 777 | 10/1997 | European Pat. Off. . |
| 62-113590 | 5/1987 | Japan . |
| 62-99346 | 5/1987 | Japan . |
| 62-263086 | 11/1987 | Japan . |

*Primary Examiner*—Veronica P. Hoke
*Attorney, Agent, or Firm*—Wenderoth, Lind & Ponack, LLP

[57] ABSTRACT

An undercoating composition layer to intervene between the surface of a substrate, e.g., a silicon wafer, and a photoresist layer to prevent noxious reflection of exposure light on the substrate surface in the photolithographic patterning work for the manufacture of semiconductor devices comprising: (A) a nitrogen-containing organic compound, as a crosslinking agent, having, in a molecule, at least two amino groups each substituted by at least one substituent selected from the group consisting of hydroxyalkyl groups and alkoxyalkyl groups; and (B) a homopolymer of or a copolymer of a mixture of monomers of which one is a (meth)acrylic acid ester of an aromatic hydroxyl compound selected from the group consisting of bisphenylsulfone compounds having at least one hydroxyl group in a molecule and benzophenone compounds having at least one hydroxyl group in a molecule in a specified proportion.

10 Claims, No Drawings

UNDERCOATING COMPOSITION FOR PHOTOLITHOGRAPHIC PATTERNING

BACKGROUND OF THE INVENTION

The present invention relates to a novel undercoating composition for photolithographic patterning on a substrate surface or, more particularly, to a coating composition for forming an undercoating layer between the surface of a substrate and a photoresist layer with an object to efficiently prevent reflection of the exposure light on the substrate surface with good conformability and good workability in coating works even to a substrate surface having stepped level differences as well as little sublimation of the ingredients at an elevated temperature encountered during processing.

It is a remarkable trend in recent years in the technology of semiconductor devices that, along with the increasing degree of integration in the semiconductor devices, ultraviolet lights of shorter and shorter wavelengths are used for pattern-wise exposure of the photoresist layer in the photolithographic patterning so that the major current of the photolithographic patterning technology is now in the use of the i-line light of 365 nm wavelength, deep ultraviolet light and excimer laser beams. One of the serious problems accompanying the use of the above mentioned short-wavelength ultraviolet lights is reflection of the exposure light on the substrate surface because the reflecting light necessarily passes through the photoresist layer resulting in local deformation or so-called notching of the pattern formed in the resist layer and degradation in the dimensional accuracy of the resist pattern formed by the photolithographic patterning. Accordingly, it is a measure now under development as a remedy of this drawback that a reflection-preventing undercoating layer is interposed between the substrate surface and the photoresist layer formed thereon. Various types of reflection-preventing undercoating compositions have been proposed for this method, referred to as the BARC (bottom anti-reflective coating) method.

While the principal object heretofore in the use of a BARC composition in photolithographic patterning is to accomplish a higher degree of reflection preventing effect, the undercoating composition for the BARC method is required to have excellent conformability even to a substrate surface having stepped level differences. Further, the undercoating composition is required to exhibit a high selectivity ratio in etching between the undercoating layer and the photoresist layer thereon or, namely, the ratio of the etching rate of the undercoating layer to that of the photoresist layer thereon.

Besides the above mentioned selectivity ratio, a BARC composition is required to exhibit excellent workability in coating works to give an undercoating layer of high uniformity without being influenced by the gas flow caused by the nitrogen flashing of or exhaust gas discharge from the heat-treatment furnace which may cause unevenness in the coating layer.

A further problem to be taken into consideration in the formulation of a BARC composition is sublimation of the ingredients. While the coating composition is compounded usually with an ultraviolet absorbing agent with an object to enhance the anti-reflective effect, namely, many of conventional ultraviolet absorbing compounds more or less have sublimability so that, when the undercoating composition is compounded with such a sublimable ultraviolet absorbing compound, the compound sometimes is sublimated and deposited in the course of the photolithographic patterning process on the inner walls of the treatment chambers or ovens so as to greatly disturb the succeeding processes. Therefore, it is very important that any of the ingredients in the undercoating composition exhibit no or little sublimation at an elevated temperature of processing.

SUMMARY OF THE INVENTION

The present invention accordingly has an object, in view of the above described problems in the conventional BARC compositions, to provide a novel and improved undercoating composition for photolithographic patterning on a substrate surface, which forms an anti-reflective undercoating layer capable of exhibiting a high anti-reflective effect against reflection of the exposure light on the substrate surface along with excellent conformability to and coating workability on a substrate surface having stepped level differences as well as no or little sublimability of the ingredients at an elevated temperature.

Thus, the undercoating composition of the present invention suitable for use in the photolithographic patterning on a substrate surface comprises, as a uniform solution in an organic solvent:

(A) a nitrogen-containing organic compound, is a crosslinking agent, having, in a molecule, at least two amino groups substituted by at least one substituent selected from the group consisting of hydroxyalkyl groups and alkoxyalkyl groups; and (B) a homopolymer of or a copolymer of a mixture of monomeric compounds of which one is a (meth)acrylic acid ester of an aromatic hydroxyl compound selected from the group consisting of bisphenylsulfone compounds having at least one hydroxyl group in a molecule and benzophenone compounds having at least one hydroxyl group in a molecule, the weight proportion of the component (A) to component (B) being in the range from 40:60 to 90:10.

Though optional, the above defined undercoating composition of the invention further comprises:

(C) an ultraviolet absorbing compound in an amount in the range from 3% to 30% by weight based on the total amount of the components (A), (B) and (C).

DETAILED DESCRIPTION OF THE PREFERRED EMBODIMENTS

As is described above, the undercoating composition of the invention comprises, as the essential ingredients dissolved in an organic solvent, (A) a nitrogen-containing organic compound which serves as a crosslinking agent for a resinous ingredient as the component (B) in a specified weight proportion.

The component (A) to serve as a crosslinking agent for the resinous ingredient as the component (B) is a nitrogen-containing organic compound having, in a molecule, at least two amino groups substituted by at least one substituent selected from the group consisting of hydroxyalkyl groups and alkoxyalkyl groups. Examples of suitable nitrogen-containing organic compounds include melamine, urea, guanamine, aceto-guanamine, benzoguanamine, glycoluryl, succinylamide and ethyleneurea substituted for the hydrogen atoms of the amino groups by one or more of methylol groups, alkoxymethyl groups or a combination thereof. These compounds having substituted amino groups can be prepared by the methylolation reaction of the starting amino-containing compound, i.e. melamine, urea, guanamine, acetoguanamine, benzoguanamine, glycoluryl, succinylamide or ethyleneurea, with formaldehyde in boiling water, optionally, followed by an alkoxylaticn reaction of the methylol-hydrogen atoms with a lower alcohol such as methyl, ethyl, n-propyl, isopropyl, n-butyl and isobutyl alcohols.

Among the above named nitrogen-containing organic compounds, those preferable are the melamine compounds, benzoguanamine compounds and glycoluryl compounds or those more preferable are the melamine compounds substituted for the amino-hydrogen atoms therein by methylol groups, alkoxymethyl groups or a combination thereof. The melamine compounds can be in the form of a dimer or trimer. As to the degree of substitution for the amino-hydrogen atoms, the melamine compound should preferably have 3 to 6 on an average of the methylol and/or alkoxymethyl groups per melamine ring. As the substituted glycoluryl compound, butoxymethylated glycoluryls such as Cymel 1170 and methylolated glycoluryls such as Cymel 1172 are available on the market.

Further, several grades of commercial products are available as the above mentioned substituted melamine and benzoguanamine compounds including MX-750 and MW-30 (each a product of Sanwa Chemical Co.) as melamine compounds having 3.7 and 5.8, respectively, on an average of methoxymethyl groups per melamine ring, Cymels 300, 301, 303, 350, 370, 771, 325, 327, 703 and 712 as methoxymethyl-substituted melamine compounds, Cymels 235, 236, 238, 212, 253 and 254 as methoxymethyl- and butoxymethyl-substituted melamine compounds, Cymels 506 and 508 as butoxymethyl-substituted melamine compounds, Cymel 1141 as a carboxyl-containing, methoxymethyl- and isobutoxymethyl-substituted melamine compounds, Cymel 1123 as a methoxymethyl- and ethoxymethyl-substituted benzoguanamine compound, Cymel 1123-10 as a methoxymethyl- and butoxymethyl-substituted benzoguanamine compound, Cymel 1128 as a butoxymethyl-substituted benzo-guanamine compound and Cymel 1125-80 as a carboxyl-containing, methoxymethyl- and ethoxymethyl-substituted benzoguanamine compound (each a product of Mitsui Cyanamide Co.).

When the pattern-wise exposure of the photoresist layer is undertaken with a KrF excimer laser beam ais the light source, in particular, Cymels 1123, 1123-10, 1128 and 1125-80 as the substituted benzoguanamine compounds are preferable because these compounds have a low transmissivity of the ultraviolet light of about 248 nm wavelength which is the wavelength of the laser beam or Cymel 1125-80 having carboxyl groups is more preferable. It is of course optional that the component (A) as a crosslinking agent is a combination of two kinds or more of these compounds according to need.

The component (B) in the inventive undercoating composition is a resinous ingredient which is a homopolymer of a (meth)acrylic acid ester of an aromatic hydroxyl compound selected from the group consisting of bisphenylsulfone compounds having at least one hydroxyl group in a molecule and benzophenone compounds having at least one hydroxyl group in a molecule or a copolymer of a mixture of monomers of which one is the above mentioned (meth) acrylic ester monomer. This (meth)acrylic ester monomer is a compound represented by the general formula

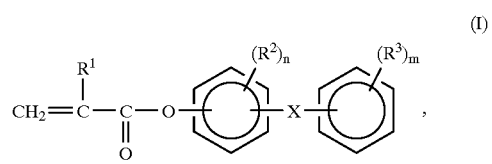

in which $R^1$ is a hydrogen atom or a methyl group, X is a sulfone group $—SO_2—$ or carbonyl group $—CO—$, $R^2$ and $R^3$ are each, independently from the others, a hydrogen atom, hydroxyl group, alkyl group, alkoxy group, e.g., tert-butoxy group, halogen atom, amino group, di(lower alkyl)amino group, carboxyl group, tert-butoxycarbonyloxy group, (lower alkoxy)-alkoxy group, tetrahydropyranyloxy group or tetrahydro-furanyloxy group, the subscript n is a positive integer not exceeding 4 and the subscript m is a positive integer not exceeding 5.

The above defined (meth)acrylic ester monomer can be prepared by the esterification reaction of a hydroxyl-containing bisphenyl compound selected from bisphenylsulfone compounds and benzophenone compounds and acrylic or methacrylic acid.

The bisphenylsulfone compounds having at least one hydroxyl group in a molecule is exemplified by bis(4-hydroxyphenyl) sulfone, bis(3-hydroxyphenyl) sulfone, bis(2-hydroxyphenyl) sulfone, bis(2,4-dihydroxyphenyl) sulfone, bis(3,4-dihydroxyphenyl) sulfone, bis(3,5-dihydroxyphenyl) sulfone, bis(3,6-dihydroxyphenyl) sulfone and bis(3,5-dimethyl-4-hydroxyphenyl) sulfone as well as these polyhydroxyl compounds of which the hydroxyl groups but at least one are optionally substituted by tert-butoxy groups, tert-butoxycarbonyloxy groups, ethoxyethoxy groups or tetrahydropyranyloxy groups.

The above mentioned benzophenone compound having at least one hydroxyl group in a molecule is exemplified by 2,4-dihydroxybenzophenone, 2,3,4-trihydroxybenzophenone, 2,2', 4,4'-tetrahydroxybenzophenone, 2,2', 5,6'-tetrahydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-amino-2'-hydroxybenzophenone, 4-dimethylamino-2'-hydroxybenzophenone, 4-diethylamino-2'-hydroxybenzophenone, 4-dimethylamino-4'-methoxy-2'-hydroxybenzophenone, 4-dimethylamino-2', 4'-dihydroxybenzophenone and 4-dimethylamino-3', 4'-dihydroxybenzophenone as well as these polyhydroxyl compounds of which the hydroxyl groups but at least one are optionally substituted by tert-butoxy groups, tert-butoxycarbonyloxy groups, ethoxyethoxy groups or tetrahydropyranyloxy groups.

The use of a hydroxyl-containing bisphenyl compound of which all of the hydroxyl groups but only one are optionally substituted by tert-butoxy groups, tert-butoxycarbonyloxy groups, ethoxyethoxy groups or tetrahydropyranyloxy groups, referred to as the protective groups hereinafter, is advantageous because the esterified monomer compound obtained therefrom with (meth)acrylic acid is limited selectively to a monoester compound without formation of polyester compounds.

The above mentioned protective group is not limited to those named above but can be selected from those capable of regenerating hydroxyl groups by dissociation at an elevated temperature for the crosslinking reaction known as an acid-dissociable solubility-reducing group in the formulation of chemical-sensitization photoresist compositions including tert-alkoxy groups such as tert-butoxy and tert-amyloxy groups, tert-alkoxycarbonyloxy groups such as tert-butoxy-carbonyloxy group, (lower alkoxy)alkoxy groups such as ethoxyethoxy and methoxypropoxy groups and acetal groups such as tetrahydropyranyloxy and tetrahydrofuranyloxy groups.

The known method used for introduction of solubility-reducing groups into an alkali-soluble resin as an ingredient in a chemical-sensitization photoresist composition is also applicable to the introduction of the protective groups into the hydroxyl-containing bisphenyl compound. It is optional that the (meth)acrylic ester monomer compound retains the protective groups introduced before the esterification reaction as such or the monomer compound has hydroxyl groups regenerated by the dissociation of the protective groups in a hydrolysis reaction with an acid leaving as small as possible number of the protective groups. It is preferable that the ester monomer compound has at least one free hydroxyl groups in a molecule in view of the higher reactivity of the (co)polymer as the component (B) in the crosslinking reaction completed at a relatively low temperature with in a short time.

Among the above named bisphenylsulfone compounds and benzophenone compounds having at least one hydroxyl group in a molecule, preferable are bis(4-hydroxyphenyl) sulfone, 4-dimethylamino-2', 4'-dihydroxybenzophenone, 4-dimethylamino-3', 4'-dihydroxybenzophenone and 4-dimethylamino-4'-methoxy-2'-hydroxybenzophenone in respect of their high ultraviolet absorptivity and high reactivity of the (co)polymer thereof in the thermal crosslinking reaction.

The esterification reaction for the preparation of the ester monomer compound of the general formula (I) is performed by dissolving the above mentioned hydroxyl-containing bisphenyl compound and acrylic or methacrylic acid in an organic solvent such as tetrahydrofuran, dimethylacetamide, dimethylformamide and dioxane with admixture of a basic catalyst such as triethylamine, triethanolamine and pyridine and heating the solution.

When the hydroxyl-containing bisphenyl compound has two or more hydroxyl groups in a molecule, it is a natural consequence that the product of the above mentioned esterification reaction contains a substantial amount of polyester compounds. When a monoester compound is to be obtained selectively, the protective groups are introduced into the hydroxyl-containing bisphenyl compound to substitute all but one of the hydroxyl groups before the esterification reaction with (meth)acrylic acid.

The (meth)acrylic ester monomer compounds of the general formula (I) obtained in this way can be used in the preparation of the resin as the component (B) either singly or as a combination of two kinds or more thereof or in combination with other ethylenically unsaturated monomeric compounds such as styrene monomers and unsaturated carboxylic acids as well as derivatives thereof as a comonomer or comoromers. When the monomeric compound of the general formula (I) is copolymerized with other ethylenically unsaturated monomers, the amount thereof in the monomer mixture should be at least 20% by moles or, preferably, in the range from 20% to 80% by moles.

The above mentioned styrene comonomers include styrene, o-, m- and p-hydroxystyrenes, α-methylstyrene, p- and o- methylstyrenes, p-methoxystyrene, p-chlorostylene and o-, m- and p-vinyl benzoic acids.

The ethylenically unsaturated monomeric compounds as the comonomer include unsaturated carboxylic acids such as acrylic, methacrylic, maleic and fumaric acids, esters of (meth)acrylic acid such as methyl (meth)acrylate, ethyl (meth)acrylate, propyl (meth)acrylate, isopropyl (meth)-acrylate, n-butyl (meth)acrylate, isobutyl (meth)acrylate, n-hexyl (meth)acrylate, octyl (meth)acrylate, 2-ethylhexyl (meth)acrylate, lauryl (meth)acrylate, 2-hydroxyethyl (meth)acrylate, 2-hydroxypropyl (meth)acrylate and glycidyl (meth)acrylate, amide compounds such as (meth) acrylamide, N-methylol (meth)acrylamide and diacetone (meth)acrylamide, (meth)acrylonitrile, vinyl chloride and ethyl vinyl ether.

The polymerization reaction for the preparation of the (co)polymer as the component (B) can be performed according to a known method for the preparation of acrylic polymers. Thus, the monomer or monomer mixture is dissolved in an up to 15 times by weight amount of an organic solvent such as ketone solvents, e.g., acetone and methyl ethyl ketone, aromatic hydrocarbon solvents, e.g., benzene, toluene and ethyl benzene, halogenated hydrocarbon solvents, e.g., carbon tetrachloride and chloroform, and cyclic ether solvents, e.g., dioxane, with addition of a radical polymerization initiator compound such as organic peroxides, e.g., tert-butyl hydro-peroxide, cumene hydroperoxide and tert-butylperoxy pivalate, and azo compounds, e.g., 2,2'-azobisisobutyronitrile and 2,2'-azobis(2,4-dimethyl) valeronitrile, in an amount of 0.01 to 3% by weight based on the amount of the monomer or monomers and the monomer solution is heated under an atmosphere of nitrogen gas.

The polymerization reaction is complete usually within 3 to 12 hours when the polymerization temperature is in the range from 50 to 100 ° C. which is adequately selected depending on various factors such as types of the monomer or monomers and polymerization initiator, weight-average molecular weight of the desired polymers and so on. After completion of the polymerization reaction, the polymerization mixture is poured into a large volume of an organic solvent having poor dissolving power to the polymer, such as methyl and ethyl alcohols, so as to precipitate the polymer which is separated from the polymerization medium and dried under reduced pressure.

When the (co)polymer is obtained from the acrylic ester monomer of the general formula (I) having one or more of the protective groups in a molecule substituting all of the free hydroxyl groups, it is advantageous that the thus obtained (co)polymer is subjected to an acid treatment so that a part or all of the protective groups are hydrolyzed to regenerate hydroxyl groups in order to improve the efficiency of the crosslinking reaction in the undercoating composition.

The (co)polymer as the component (B) has a weight-average molecular weight in the range, usually, from 2000 to 30000 or, preferably, from 3000 to 20000 although the molecular weight should be as large as possible in order to accomplish good conformability in addition to the advantages of decreased sublimation by heating at an elevated temperature, decreased susceptibility to the influences of the gas streams caused by nitrogen flashing and exhaust gas discharge and improved evenness of the coating layer.

In the formulation of the undercoating composition of the invention, the component (A) and component (B) are compounded in a weight proportion of (A):(B) in the range from 40:60 to 90:10 or, preferably, from 50:50 to 80:20 in consideration of the balance of various properties including the anti-reflective effect, conformability, sublimation reduction and coating workability.

Though optional according to need, the inventive undercoating composition comprising the components (A) and (B) can further be admixed with an ultraviolet-absorbing compound as the component (C). Various kinds of known ultraviolet-absorbing compounds can be used for this purpose without particular limitations provided that the compound is compatible with the other ingredients in the composition and capable of strongly absorbing the light of the wavelength to which the photoresist layer on the undercoating layer has photosensitivity so as to decrease the adverse influences caused by the standing waves with the reflecting light on the substrate surface and irregular reflection of the exposure light on the substrate surface.

Various classes of ultraviolet-absorbing compounds can be used as the component (C) including salicylate compounds, benzophenone compounds, benzotriazole compounds, cyanoacrylate compounds, azo compounds, polyene compounds, anthraquinone compounds, bis (polyhydroxyphenyl) sulfone compounds and bis (polyhydroxyphenyl) sulfoxide compounds, of which benzo-phenone compounds or, inter alia, polyhydroxy benzophenone compounds, bis(polyhydroxyphenyl) sulfone compounds and bis(polyhydroxyphenyl) sulfoxide compounds are preferable in respect of their good compatibility with the other ingredients and solvents, suppression of formation of an intermixing layer and promotive effect on the thermal crosslinking reaction of the composition.

The above mentioned polyhydroxybenzopherone compound can be exemplified by those given before as the examples of the hydroxyl-containing benzophenone compounds us-ed as a reactant to form the (meth)acrylic ester compound as a monomer for the preparation of the (co) polymer as the component (B). Similarly, the bis (polyhydroxyphenyl) sulfone compound can be exemplified by those given before as the examples of the hydroxyl-containing bisphenylsulfone compounds used as a reactant to form the (meth)acrylic ester compound as a monomer for the preparation of the (co)polymer as the component (B). Examples of the bis(polyhydroxyphenyl) sulfoxide compound include bis(2,3-dihydroxyphenyl) sulfoxide, bis(5-chloro-2,3-dihydroxyphenyl) sulfoxide, bis(2,4-dihydroxyphenyl) sulfoxide, bis(2,4-dihydroxy-6-methylphenyl) sulfoxide, bis(5-chloro-2,4-dihydroxyphenyl) sulfoxide, bis(2,5-dihydroxyphenyl) sulfoxide, bis(3,4-dihydroxyphenyl) sulfoxide, bis(3,5-dihydroxyphenyl) sulfoxide, bis(2,3,4-trihydroxyphenyl) sulfoxide, bis(2,3,4-trihydroxy-6-methylphenyl) sulfoxide, bis(5-chloro-2,3,4-trihydroxyphenyl) sulfoxide, bis(2,4,6-trihydroxyphenyl) sulfoxide, bis(5-chloro-2,4,6-trihydroxyphenyl) sulfoxide and the like.

When a bis(polyhydroxyphenyl) sulfone compound or bis(polyhydroxyphenyl) sulfoxide compound is used as the component (C), an advantage is obtained that the transmissivity of the undercoating layer is decreased to the deep ultraviolet light of, in particular, 248 nm wavelength. When a polyhydroxybenzophenone compound is used as the component (C), advantages are obtained that the transmissivity of the undercoating layer is decreased to the i-line light of 365 nm wavelength so as to improve the quality of the patterned resist layer on the undercoating layer along with an increase in the selectivity ratio.

Among the above described various types of the ultraviolet-absorbing compounds used as the component (C), particularly preferable are those having a hydroxyl group at the para-position of the benzene ring relative to the carbonyl, sulfone or sulfoxide group in the molecule and having a symmetrical molecular structure exemplified by 2,2', 4,4'-tetrahydroxybenzophenone, 2,2'-dihydroxy-4,4'-dimethoxybenzophenone, bis(2,4-dihydroxyphenyl) sulfone, bis-(4-hydroxyphenyl) sulfone, bis(3,5-dimethyl-4-hydroxyphenyl) sulfone, bis(2,4-dihydroxyphenyl) sulfoxide, bis(2,4-dihydroxy-6-methylphenyl) sulfoxide, bis (5-chloro-2,4-dihydroxyphenyl) sulfoxide, bis(2,3,4-trihydroxyphenyl) sulfoxide and the like because such a compound imparts the composition with further improved efficiency for the thermal crosslinking reaction. In particular, 2,2', 4,4'-tetrahydoxy-benzophenone, bis(4-hydroxyphenyl) sulfone and bis(2,4-dihydroxyphenyl) sulfoxide are more preferable in respect of little occurrence of an intermixing layer in addition to the above mentioned improved efficiency for the thermal crosslinking reaction of the composition.

Needless to say, the above described various ultraviolet-absorbing compounds as the component (C) can be used either singly or as a combination of two kinds or more according to need. The amount of the component (C), when added to the inventive undercoating composition, is in the range from 3 to 30% by weight or, preferably, from 5 to 20% by weight based on the total amount of the components (A), (B) and (C) when the anti-reflective effect and coating workability are taken into consideration.

The inventive undercoating composition comprising the above described components (A), (B) and, optionally, (C) is further admixed with various kinds of known additives having compatibility with the other ingredients in the composition such as a crosslinking promoter to accelerate the crosslinking reaction between the components (A) and (B). The amount of such a crosslinking promoter, when added, does not exceed 5% by weight based on the total amount of non-volatile ingredients in the composition. Examples of a suitable crosslinking promoter include carboxylic acids such as acetic acid, oxalic acid, maleic acid, o-hydroxybenzoic acid, 3,5-dinitrobenzoic acid and 2,6-dihydroxybenzoic acid and copolymers of o-hydroxybenzoic acid and p-xylene sold under the tradename of SAX (a product by Mitsui Toa-tsu Chemical Co.) as well as organic acid esters such as esters of a dialkyl-amino alcohol and p-toluenesulfonic acid. These crosslinking promoters are sometimes contained already in the commercial products used as the component (A).

Admixture of the inventive undercoating composition with a surface active agent has an effect to improve the coating workability of the composition and to prevent occurrence of striation in the coating layer formed therefrom. The amount of the surface active agent, when added, does not exceed 0.2% by weight based on the total amount of the non-volatile ingredients in the composition. Examples of suitable surface active agents include fluorine-containing surface active agents such as those sold under the tradenames of Surflons SC-103 and SR-100 (each a product by Asahi Glass Co.), EF-361 (a product by Tohoku Hiryo Co.) and Florads Fc-431, Fc-135, Fc-98, Fc-430 and Fc-176 (each a product by Suraitomo 3M Co.).

The undercoating composition of the invention is prepared by dissolving, simultaneously or successively in a suitable organic solvent, the above described essential and optional ingredients each in a specified amount. Examples of suitable organic solvents include: ketone solvents such as acetone, methyl ethyl ketone, cyclohexanone, methyl isoamyl ketone, 2-heptanone and 1,1,1-trimethyl acetone; polyhydric alcohols and derivatives thereof such as ethyleneglycol, ethyleneglycol monoacetate, diethyleneglycol, diethyleneglycol monoacetate, propyleneglycol and propyleneglycol monoacetate as well as monomethyl, monoethyl, monopropyl, monobutyl and monophenyl ethers thereof; cyclic ether solvents such as dioxane; and ester solvents such as ethyl lactate, methyl acetate, ethyl acetate, butyl acetate, methyl pyruvate, ethyl pyruvate, methyl 3-methoxypropionate and ethyl 3-ethoxypropionate. These organic solvents can be used either singly or as a mixture of two kinds or more according to need.

The photoresist composition, from which a photoresist layer is formed on the undercoating layer formed from the inventive undercoating composition, can be either of the negative-working type or positive-working type without particular problems and disadvantages provided that the resist layer after the patterning light exposure is developable with an aqueous alkaline solution as the developer. The photoresist compositions to meet this requirement include i) the positive-working photoresist compositions comprising a naphthoquinone diazide compound and a novoliak resin, ii) chemical-sensitization positive-working photoresist compositions comprising an acid-generating agent capable of releasing an acid by exposure to light, a compound capable of being imparted with increased solubility in an aqueous alkaline solution by decomposition in the presence of an acid and an alkali-soluble resin, iii) chemical-sensitization positive-working photoresist compositions comprising an acid-generating agent and an alkali-soluble resin having groups capable of imparting the resin with increased solubility in an aqueous alkaline solution by decomposition in the presence of an acid and iv) chemical-sensitization negative-working photoresist compositions comprising an acid-generating agent, a crosslinking agent and an alkali-soluble resin, though not particularly limitative thereto.

Following is a description of the procedure of using the undercoating composition of the present invention in photolithographic patterning. Thus, in the first place, a substrate such as a semiconductor silicon wafer is uniformly coated with the undercoating composition in the form of a solution by using a suitable coating machine such as spinners followed by baking at a temperature in the range from 100 to 300° C. to form a dried undercoating layer having a thickness of 0.05 to 0.5 µm. The undercoating composition forming the layer becomes insolubilized in an aqueous alkaline solution as a result of the crosslinking reaction by this baking treatment. Thereafter, the thus formed undercoating layer is uniformly overcoated with a photoresist composition in the form of a solution by using a suitable coating machine followed by drying to form a photoresist layer on the undercoating layer. The photoresist layer is then pattern-wise exposed to ultraviolet light by using an ultraviolet light source such as low-pressure mercury lamps, high-pressure mercury lamps, ultrahigh-pressure mercury lamps, arc lamps, xenon lamps and excimer lasers through a photomask bearing a desired pattern or irradiated with electron beams under pattern-wise scanning to form a latent image of the pattern in the photoresist layer. A post-exposure baking treatment is usually undertaken. The photoresist layer having the pattern-wise latent image is subjected to a development treatment by using an aqueous alkaline developer solution such as a 1 to 10% by weight aqueous solution of tetramethyl-ammonium hydroxide so that the resist layer on the exposed areas, when the photoresist composition is of the positive-working type, or on the unexposed areas, when the photoresist composition is of the negative-working type, is dissolved away to leave the resist layer patterned with fidelity to the photomask pattern.

In the next place, the undercoating layer in the areas where the resist layer has been removed by development is removed by dry etching using an etching gas such as chlorine, the patterned resist layer serving as a resist against this dry etching. It is optional that this dry etching treatment is preceded by a silylating treatment of the patterned resist layer on the undercoating layer with an object to effect an increase of the selectivity ratio between the resist layer and the undercoating layer. The silylating treatment is performed according to a known method in which the patterned resist layer is exposed to the vapor of a silylating agent such as hexamethyl disilazane, hexamethyl cyclotrisilazane and other polyfunctional silazane compounds for 1 to 60 minutes at a temperature of 30 to 100 ° C., though not particularly limitative thereto.

In the following, the undercoating composition of the present invention is described in more detail by way of Examples as preceded by a description of the preparation procedures of several bisphenyl sulfone compounds and benzophenone compounds as well as the polymers as the component (B) prepared therefrom. In the following description, the term of "parts" always refers to "parts by weight".

Preparation 1.

A solution was prepared by dissolving 250 g (1 mole) of bis(4-hydroxyphenyl)sulfone and 109 g (0.5 moles) of di-tert-butyl dicarbonate in 3150 g of dioxane under agitation, to which a solution of 25 g (0.25 mole) of triethylamine in 100 g of dioxane was added dropwise at room temperature over a period of 15 minutes to form a reaction mixture.

After 2 hours of continued agitation, the reaction mixture was distilled to remove dioxane as the solvent and the residue was repeatedly recrystallized from methyl ethyl ketone to give 158 g of a product which could be identified to be 4-hydroxyphenyl-4'-tert-butyloxycarbonyloxyphenyl sulfone expressed by the structural formula

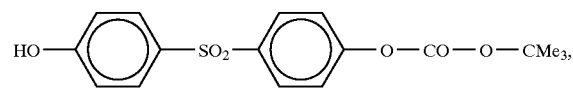

in which Me is a methyl group.

In the next place, 315 g (0.9 mole) of the sulfone compound obtained by the above described synthetic procedure and 126 g (1.25 moles) of triethylamine were dissolved in 2835 g of dimethylacetamide under agitation to form a solution, to which a solution of 104 g (1 mole) of methacryl chloride in 244 g of dimethylacetamide was added dropwise at room temperature over a period of 30 minutes to form a reaction mixture.

After continued agitation for 2 hours at 35 to 40 ° C., the reaction mixture was filtered and the filtrate was poured into 3 liters of 0.1 N hydrochloric acid solution to obtain precipitates which were collected by filtration and washed three times with a 0.5 N aqueous solution of sodium hydroxide followed by repeated recrystallization from acetonitrile to obtain 200 g of a product which could be identified to be a methacrylic ester of the bisphenyl sulfone compound expressed by the structural formula

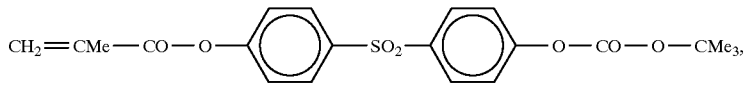

referred to as the methacrylic sulfone compound hereinafter.

Preparation 2.

A polymerization mixture was prepared by dissolving 100 g (0.19 mole) of the methacrylic sulfone compound obtained in Preparation 1 and 1 g of azobisisobutyronitrile in 900 g of dioxane, which was heated at 80° C. for 4 hours under an atmosphere of nitrogen gas to effect polymerization of the compound. With an object to remove the unpolymerized monomeric compound, the thus obtained polymer solution was poured into 4 liters of methyl alcohol to precipitate the polymer which was subjected to additional two times of the reprecipitation treatment to give 50 g of a polymer of the methacrylic sulfone compound. This polymer had a weight-average molecular weight of 4700 and the dispersion of the molecular weight distribution was 2.7.

The above obtained polymer was subjected to a partial hydrolysis reaction to convert a part of the tert-butoxy-carbonyloxy groups into hydroxyl groups. Thus, 100 g of the polymer obtained in the above described manner were dissolved in 900 g of dioxane to form a polymer solution, to which 30 g of 35% hydrochloric acid were added dropwise, and the solution was heated for 4 hours at 90° C. The polymer solution was poured into 6 liters of water to precipitate the polymer which was taken by filtration and dried to give 32 g of a partially hydrolyzed polymer which had a weight-average molecular weight of 3200 with a dispersion of the molecular weight distribution of 1.9.

Preparation 3.

A solution was prepared by dissolving 244 g (0.9 mole) of 4-dimethylamino-2'-hydroxy-4'-methoxy benzophenone and 126 g (1.25 moles) of triethylamine in 2196 g of dimethylacetamide under agitation, to which a solution of 104 g (1 mole) of methacryl chloride in 936 g of dimethylacetamicle was added dropwise at 10° C. over a period of 30 minutes to form a reaction mixture.

After 4 hours of continued agitation at 10 to 15° C., the reaction mixture was distilled to remove dimethylacetamide as the solvent and the residue was dissolved in 1000 ml of ethyl acetate to form a solution which was washed three times with a 2.8% ammonia water. After removal of ethyl acetate by evaporation from the organic solution as separated from the aqueous phase, the residue was repeatedly recrystallized from toluene to give 220 g of a product which could be identified to be a compound expressed by the structural formula

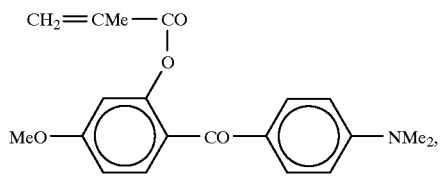

which is referred to as the methacrylic benzophenone compound hereinafter.

Preparation 4.

A polymerization mixture was prepared by dissolving 100 g (0.23 mole) of the methacrylic benzophenone compound obtained in Preparation 3, 100 g (0.57 mole) of p-tert-butoxystyrene and 30 g of azobisisobutyronitrile in 1800 g of dioxane, which was heated at 80° C. for 4 hours under an atmosphere of nitrogen gas to effect copolymerization of the monomeric compounds. With an object to remove the unpolymerized monomeric compounds, the thus obtained copolymer solution was poured into 4 liters of n-heptane to precipitate the polymer which was subjected to an additional reprecipitation treatment to give 100 g of the copolymer of the two monomeric compounds. This polymer had a weight-average molecular weight of 6100 and the dispersion of the molecular weight distribution was 4.2.

In the next place, 100 g of this polymer were dissolved in 900 g of dioxane to form a polymer solution to which 20 g of 35% hydrochloric acid were added dropwise under agitation and the solution was heated at 80° C. for 4 hours to effect the hydrolysis reaction of the 4-tert-butoxystyrene moiety. After completion of the reaction, the reaction mixture was poured into 4 liters of water to precipitate the polymer which was taken by filtration and dried to give 100 g of a polymeric product which was a copolymer of the methacrylic benzophenone compound and 4-hydroxystyrene. The copolymer had a weight average molecular weight of 5700 and dispersion of the molecular weight distribution of 4.2.

EXAMPLE 1

An undercoating composition in the form of a solution was prepared by dissolving, in 810 parts of propyleneglycol monomethyl ether acetate, 30 parts of the polymer obtained in Preparation 2 after the hydrolysis reaction and 60 parts of a carboxyl group-containing methoxymethylated, ethoxymethylated benzoguanamine containing a curing catalyst which was an ester of p-toluenesulfonic acid and a dialkylamino alcohol (Cymel 1125-80, a product by Mitsui Cyanamide Co.) with further admixture of a fluorine-containing surface active agent (Fc-430, a product by Sumitomo 3M Co.) in an amount of 0.1% by weight based on the non-volatile matter in the solution followed by filtration of the solution through a membrane filter having a pore diameter of 0.2 μm.

This undercoating composition was subjected to evaluation tests for several items described later to give results shown in Table 1 to follow.

EXAMPLE 2

The formulation of the undercoating composition was the same as in Example 1 described above excepting for additional admixture of 10 parts of bis(4-hydroxyphenyl) sulfone and increase of the amount of propyleneglycol monornethyl ether acetate from 810 parts to 900 parts.

The results of the evaluation tests are also shown in Table 1.

COMPARATIVE EXAMPLE

The formulation of the undercoating composition was the same as in Example 2 described above excepting for omission of the polymer obtained in Preparation 2 and increase of the amount of bis(4-hydroxyphenyl) sulfone from 10 parts to 40 parts.

EXAMPLE 3

An undercoating composition in the form of a solution was prepared by dissolving, in 900 parts of propyleneglycol monomethyl ether acetate, 50 parts of the copolymer obtained in Preparation 4 after the hydrolysis reaction and 50 parts of a carboxyl group-containing methoxymethylated, ethoxy-methylated benzoguanamine containing a curing catalyst which was an ester of p-toluenesulfonic acid and a dialkylamino alcohol (Cymel 1125-80, supra) with further admixture of a fluorine-containing surface active agent (Fc-430, supra) in an amount of 0.1% by weight based on the non-volatile matter in the solution followed by filtration of the solution through a membrane filter having a pore diameter of 0.2 μm.

The results of the evaluation tests are also shown in Table 1.

Following is a description of the testing procedures for the evaluation of the undercoating compositions prepared in the above described manner for the respective items.

(1) Conformability

Conformability of the undercoating composition could be represented by the viscosity at 25° C. of a solution of the composition having a concentration of the non-volatile ingredients adjusted to such an extent that the coating film on a substrate formed from the undercoating solution by spin-coating on a spinner rotating at 3000 rpm had ea thickness of 0.2 μm in view of the fact that a coating solution having a higher viscosity could have better conformability assuming a constant thickness of the undercoating layer obtained by using the undercoating solutions.

(2) Sublimation of ingredients

A semiconductor silicon wafer of which the surface had a stepped level difference of 0.2 μm height was uniformly coated with the undercoating solution by using a spinner to form an undercoating layer having a thickness of 0.2 μm on the smooth and flat areas after drying at 90° C. for 90 seconds. The thus formed undercoating layer was subjected to a baking treatment at 180° C. for 90 seconds in a baking oven under an atmosphere of nitrogen gas and, after the silicon wafer was taken out of the oven, the inner walls of the oven were visually inspected to detect deposition of any sublimates thereon.

(3) Unevenness of coating

The undercoating layer on the semiconductor silicon wafer after the baking treatment in the sublimation test described above was visually examined to record the appearance of unevenness as "no" or "yes".

(4) Cross sectional profile of patterned resist layer after dry etching (I)

The undercoating layer on the silicon wafer after the baking treatment in the sublimation test (2) above was coated on a spinner with a positive-working chemical-sensitization photoresist composition containing a polyhydroxystyrene-based resin and an acid-generating agent (TDUR-P007, a product by Tokyo Ohka Kogyo Co.) followed by drying at 90° C. for 90 seconds to form a photoresist layer having a thickness of 0.7 μm. The thus formed photoresist layer was pattern-wise exposed to ultraviolet light of 248 nm wavelength through a pattern-bearing photomask on an exposure machine (Model NSR-2005EX8A, manufactured by Nikon Co.) and subjected to a post-exposure baking treatment at 110° C. for 90 seconds followed by a development treatment with a 2.38% by weight aqueous solution of tetramethylammonium hydroxide to have the resist layer patterned with fidelity to the photomask pattern.

In the next place, the silicon wafer bearing the patterned resist layer on the undercoating layer was subjected to a dry etching treatment in a plasma etching apparatus (Model TUE-1102, manufactured by Tokyo Ohka Kogyo Co.) with chlorine gas as the etchant under a pressure of 30 mTorr at 20° C. with an output of 150 watts for plasma generation for 120 seconds. The patterned resist layer after this dry etching treatment was examined for the cross sectional profile of the line-patterned layer on a scanning electron microscopic photograph to record the results in two ratings of: A for an orthogonal profile with sharply edged shoulder corners; and B for a profile having rounded shoulders.

(5) Cross sectional profile of patterned resist layer after dry etching (II)

The undercoating layer on the silicon wafer after the baking treatment in the sublimation test (2) above was coated on a spinner with a negative-working chemical-sensitization photoresist composition containing a polyhydroxystyrene-based resin, a crosslinking agent and an acid-generating agent (THMR-iN200, a product by Tokyo Ohka Kogyo Co.) followed by drying at 90° C. for 90 seconds to form a photoresist layer having a thickness of 0.7 μm. The thus formed photoresist layer was pattern-wise exposed to ultraviolet light of 365 nm wavelength through a pattern-bearing photomask on a minifying projection exposure machine (Model NSR-2005i10D, manufactured by Nikon Co.) and subjected to a post-exposure baking treatment at 110° C. for 90 seconds followed by a development treatment with a 2.38% by weight aqueous solution of tetra-methylammonium hydroxide to have the resist layer patterned with fidelity to the photomask pattern.

In the next place, the silicon wafer bearing the patterned resist layer on the undercoating layer was subjected to a dry etching treatment under the same conditions as in the test (4) above. The patterned resist layer after this dry etching treatment was examined for the cross sectional profile of the line-patterned layer in the same manner as in the test (4) above to record the results in two ratings of A and B with the same criteria as in the test (4).

TABLE 1

|  | Example | | | Comparative |
| --- | --- | --- | --- | --- |
|  | 1 | 2 | 3 | Example |
| Conformability viscosity, cP | 2.2 | 2.1 | 2.3 | 2.0 |
| Sublimation of ingredients | no | no | no | yes |
| Unevenness of coating | no | no | no | yes |
| Cross sectional profile (I) or (II) | (I) A | (I) A | (II) A | (I) B |

What is claimed is:

1. An undercoating composition suitable for use in the photolithographic patterning on a substrate surface which comprises, as a uniform solution in an organic solvent:

(A) a nitrogen-containing organic compound, as a crosslinking agent, having, in a molecule, at least two amino groups each substituted by at least one substituent selected from the group consisting of hydroxyalkyl groups and alkboxyalkyl groups; and (B) a homopolymer of or a copolymer of a mixture of monomers of which one is a (meth)acrylic acid ester of an aromatic hydroxyl compound selected from the group consisting of bisphenylsulfone compounds having at least one hydroxyl group in a molecule and benzophenone compounds having at least one hydroxyl group in a molecule, the weight proportion of the component (A) to component (B) being in the range from 40:60 to 90:10.

2. The undercoating composition as claimed in claim 1 in which the crosslinking agent as the component (A) is a melamine compound or a benzoguanamine compound of which the amino groups are substituted for the hydrogen atoms thereof by methylol groups, alkoxyalkyl groups or a combination thereof.

3. The undercoating composition as claimed in claim 1 in which the (meth)acrylic ester of an aromatic hydroxyl compound is a compound represented by the general formula

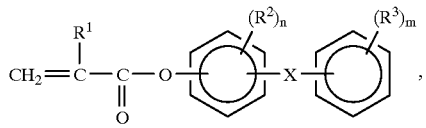

in which $R^1$ is a hydrogen atom or a methyl group, X is a sulfone group —$SO_2$— or carbonyl group —CO—, the groups denoted by $R^2$ and $R^3$ are each, independently from the others, a hydrogen atom, hydroxyl group, alkyl group, alkoxy group, halogen atom, amino group, dialkylamino group, carboxyl group, tert-butoxycarbonyloxy group, alkoxyalkoxy group, tetrahydro-pyranyloxy group or tetrahydrofuranyloxy group, the subscript n is a positive integer not exceeding 4 and the subscript m is a positive integer not exceeding 5.

4. The undercoating composition as claimed in claim 1 in which the homopolymer or copolymer as the component (B) has a weight-average molecular weight in the range from 2000 to 30000.

5. The undercoating composition as claimed in claim 1 in which the weight proportion of the component (A) and component (B) is in the range from 50:50 to 80:20.

6. The undercoating composition as claimed in claim 1 in which, when the component (B) is a copolymer of a (meth) acrylic acid ester of an aromatic hydroxyl compound, the mixture of monomers comprises a styrene compound, (meth)acrylic acid or an ester thereof.

7. The undercoating composition as claimed in claim 1 which further comprises:

(C) an ultraviolet light absorbing compound, the amount of the component (C) being in the range from 3 to 30% by weight based on the total amount of the components (A), (B) and (C).

8. The undercoating composition as claimed in claim 7 in which the ultraviolet light absorbing compound as the component (C) is selected from the group consisting of bis(polyhydroxyphenyl) sulfone compounds, bis(polyhydroxyphenyl) sulfoxide compounds and polyhydroxy benzophenone compounds.

9. The undercoating composition as claimed in claim 7 in which the amount of the ultraviolet light absorbing compound as the component (C) is in the range from 5 to 20% by weight based on the total amount of the components (A), (B) and (C).

10. The undercoating composition as claimed in claim 3 in which the (meth)acrylic ester is an ester of (meth)acrylic acid with an aromatic hydroxyl compound selected from the group consisting of bis(4-hydroxyphenyl) sulfone, 4-dimethylamino-2', 4'-dihydroxybenzophenone, 4-dimethylamino-3', 4'-dihydroxybenzophenone and 4-dimethylamino-4'-methoxy-2'-hydroxybenzophenone.

* * * * *